(12) United States Patent
Ambo et al.

(10) Patent No.: US 7,893,727 B2
(45) Date of Patent: Feb. 22, 2011

(54) SEMICONDUCTOR INTEGRATED CIRCUIT DEVICE

(75) Inventors: Takanobu Ambo, Tokyo (JP); Hirokazu Shimizu, Tokyo (JP)

(73) Assignee: Renesas Electronics Corporation, Kawasaki (JP)

(*) Notice: Subject to any disclaimer, the term of this patent is extended or adjusted under 35 U.S.C. 154(b) by 24 days.

(21) Appl. No.: 12/400,827

(22) Filed: Mar. 10, 2009

(65) Prior Publication Data

US 2009/0267653 A1    Oct. 29, 2009

(30) Foreign Application Priority Data

Apr. 23, 2008 (JP) .............................. 2008-112595

(51) Int. Cl.
*G11C 27/02* (2006.01)
*H03K 5/00* (2006.01)
*H03K 17/00* (2006.01)
(52) U.S. Cl. .......................................... 327/94; 327/96
(58) Field of Classification Search .................. 327/91, 327/94–96; 341/122
See application file for complete search history.

(56) References Cited

U.S. PATENT DOCUMENTS

| 5,844,431 A | 12/1998 | Chen |
| 5,963,156 A * | 10/1999 | Lewicki et al. ............... 341/122 |
| 6,437,608 B1 * | 8/2002 | Miyabe et al. ................ 327/96 |
| 6,753,913 B1 | 6/2004 | Bilhan et al. |
| 6,965,258 B2 * | 11/2005 | Bogner .......................... 327/94 |
| 7,208,983 B2 * | 4/2007 | Imaizumi et al. .............. 327/94 |
| 7,295,143 B2 * | 11/2007 | Ambo et al. ................. 341/172 |
| 2005/0018061 A1 * | 1/2005 | Choi .......................... 348/255 |

FOREIGN PATENT DOCUMENTS

| JP | 11-103422 A | 4/1999 |
| JP | 2002-57945 A | 2/2002 |
| JP | 2005-45786 A | 2/2005 |

* cited by examiner

*Primary Examiner*—Quan Tra
(74) *Attorney, Agent, or Firm*—Mattingly & Malur, P.C.

(57) ABSTRACT

For a semiconductor integrated circuit device such as AFE including a CDS amplifier, in case of excessive signal input to the CDS amplifier, a technique capable of preventing the response characteristic of the CDS amplifier from deteriorating is provided. In the AFE including the CDS amplifier, the CDS amplifier is prevented from becoming saturated by detecting an excessive signal input and triggering the reset of the CDS amplifier. Thereby, no abnormality occurs in the transient response of the CDS amplifier. Specifically, comparison of input signals to the CDS amplifier is performed by a comparator and the CDS amplifier is reset by a reset circuit (by fixing the input terminals of the CDS amplifier to a constant voltage) in case of excessive signal input, so that the CDS amplifier will not amplify excessive signal inputs.

7 Claims, 13 Drawing Sheets

SEMICONDUCTOR INTEGRATED CIRCUIT DEVICE

CROSS-REFERENCE TO RELATED APPLICATIONS

The disclosure of Japanese Patent Application No. 2008-112595 filed on Apr. 23, 2008 including the specification, drawings and abstract is incorporated herein by reference in its entirety.

BACKGROUND OF THE INVENTION

The present invention relates to a semiconductor integrated circuit device and, particularly, relates to a technique that is effectively applied in configuring a preprocessing LSI (hereinafter referred to as "AFE") for mobile phones equipped with a camera, digital still cameras and digital video cameras.

As related art examined by the present inventors, for example, a technique for configuring AFE is considered, which will be outlined below.

Figure 11:
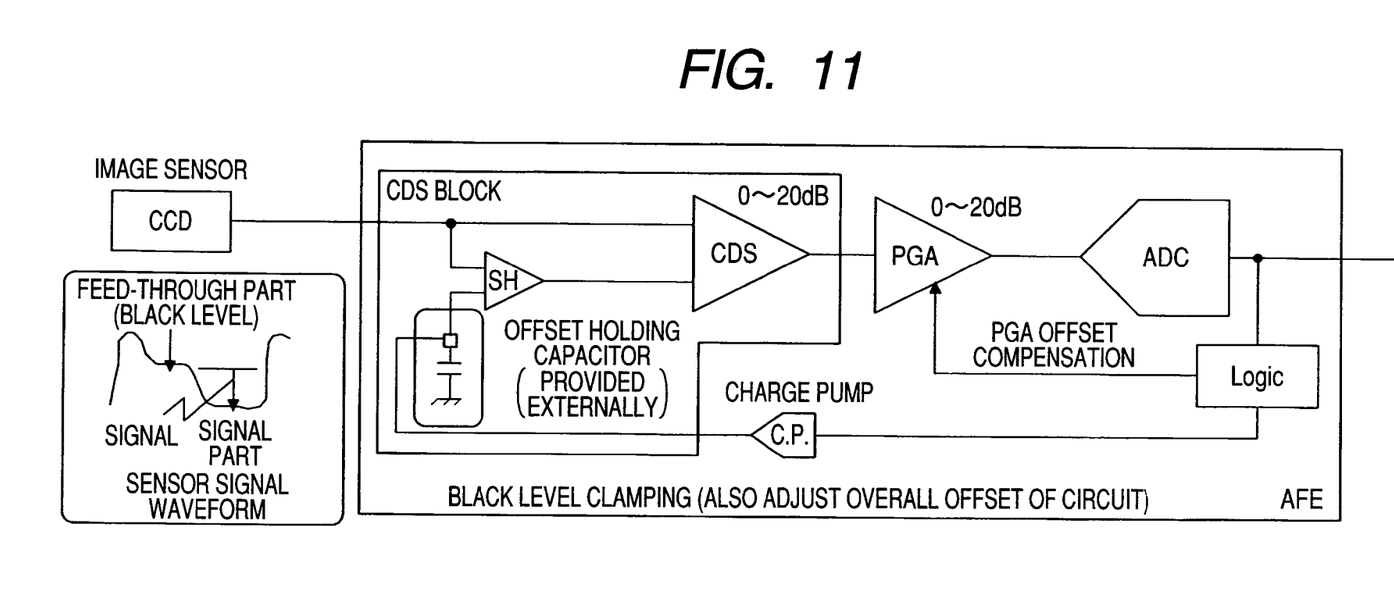
FIG. 11 is a block diagram showing an AFE configuration examined as related art assumed to be improved by the present invention.

FIG. 11 is a block diagram showing an AFE configuration examined as related art assumed to be improved by the present invention.

As shown in FIG. 11, the AFE examined as related art assumed to be improved by the present invention is comprised of a CDS block, a PGA amplifier, an A/D converter (ADC), a logic circuit (Logic), a charge pump (C.P) and other elements. The CDS block is comprised of a sample and hold amplifier (SH), an offset holding capacity which is provided externally, a CDS amplifier, etc.

Sensor signals are input from an image sensor (CCD) to the CDS block and signal components are extracted therefrom in the CDS block. These signal components are amplified by the PGA amplifier and converted into digital data by the ADC. A sensor signal waveform from the image sensor (CCD) principally comprises a feed-through part (black level) and a signal part (signal component).

As used herein, ADC is an abbreviation of "Analog-to-Digital Converter", CDS is an abbreviation of "Correlated Double Sampling", SH is an abbreviation of "Sample Hold", PGA is an abbreviation of "Programmable Gain Amplifier", C. P is an abbreviation of "Charge Pump", and AFE is an abbreviation of "Analog Front End".

Figure 12:
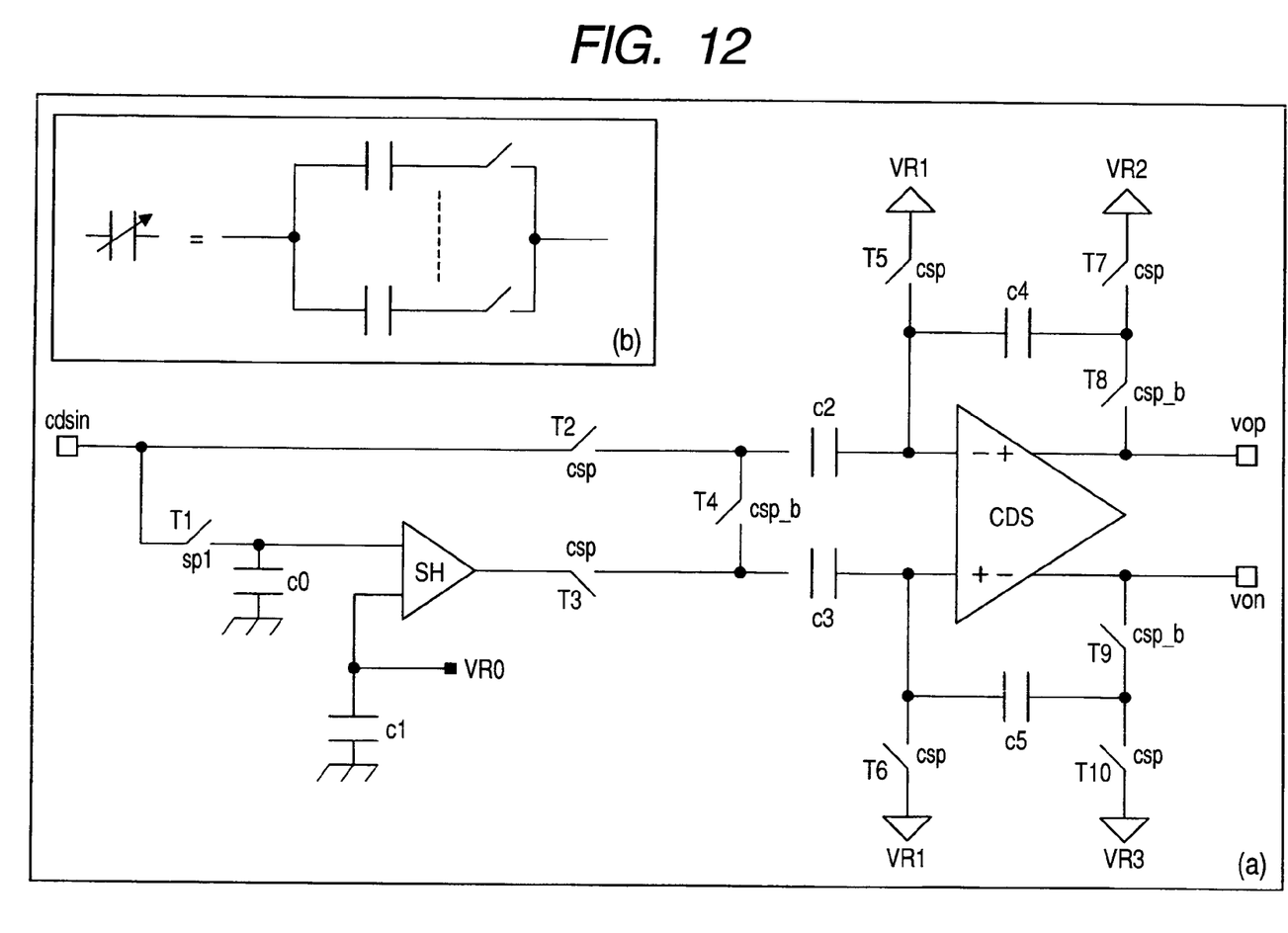
Figure 13:
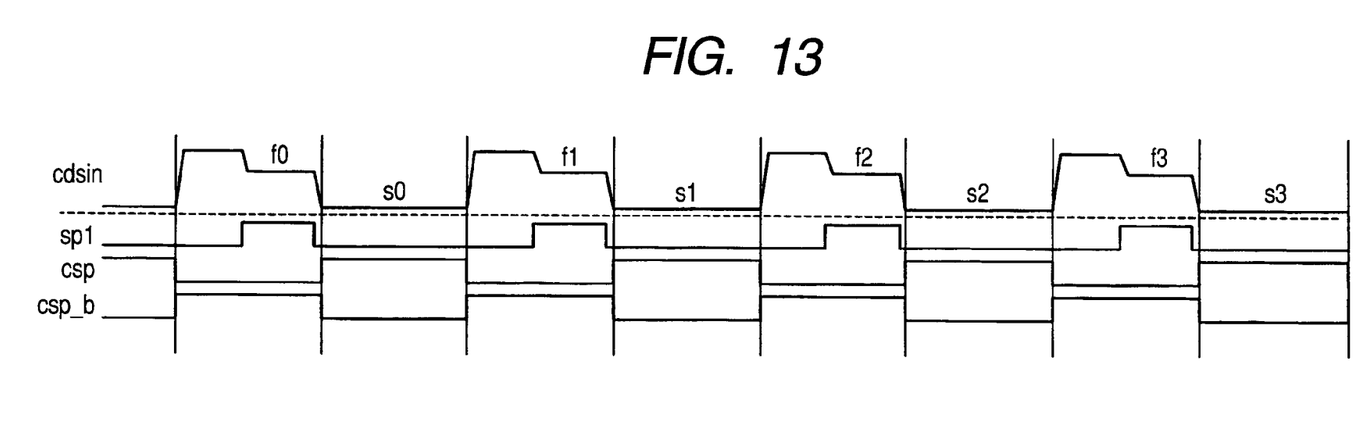
FIG. 13 is a waveform chart showing operation timing of the CDS block in FIG. 12.

FIG. 12(a) is a circuit diagram showing a specific configuration example of the CDS block shown in FIG. 11. FIG. 12(b) is a diagram showing a configuration example of input capacitors c2, c3 (variable capacitors). FIG. 13 is a waveform chart showing operation timing of the CDS block shown in FIG. 12.

As shown in FIG. 12(a), the CDS block is configured as a switched capacitor type CDS circuit that is comprised of the following elements: input switches T1, T2, T3; input capacitors c0, c2, c3; an offset holding capacitor c1 for holding a signal VR0 to cancel out a sensor offset; feedback capacitors c4, c5; switches T5, T6, T7, T10 for coupling the feedback capacitors c4, c5 to reference voltages VR1, VR2, VR3; switches T8, T9 for coupling the feedback capacitors c4, c5 to a positive output vop and a negative output von; a switch T4 for short circuiting input lines to the input capacitors c2, c3, when signal amplification is performed; and the like. The input capacitors c2, c3 are variable capacitors configured such that their capacitances can be controlled by switching operation of switches as shown in FIG. 12(b). Thereby, the gain of the CDS amplifier can be made variable.

Referring to FIG. 13, this CDS block operates as follows. For each signal that is input from the image sensor (CCD) to a sensor signal input cdsin, its feed-through part f0 is sampled on an input capacitor c0 via an input switch T1. A difference between the feed-through part f0 and a signal VR0 is output at the sample and hold amplifier (SH) which holds a black level signal. The signal VR0 is an offset voltage that is applied to cancel out the sensor offset. Then, the input switch T1 turns off and the output of the sample and hold amplifier (SH) is sampled on an input capacitor c3 via an input switch T3. At the same time, the signal part s0 of each signal input to the sensor signal input cdsin is sampled on an input capacitor c2 via an input switch T2. At this time, feedback capacitors c4, c5 are coupled to reference voltages VR1 to VR3. Then, the input switches T2, T3 and switches T5 to T7 and T10 turn off and switches T4, T8 and T9 turn on, so that the signal is amplified by a gain that is determined by c2/c4 and c3/c5. In this way, the CDS block operates to amplify a difference between the feed-through part (black level) and the signal part of an input signal.

The present applicant investigated into prior art from the viewpoint of "providing a reset circuit that works in case of an excessive input to the CDS amplifier used in the AFE circuit" based on results obtained by the invention. As a result, Patent Documents 1 to 3 are extracted. Patent Document 1 relates to an AFE circuit including a correction logic circuit that corrects offset and eliminates noise. Patent Document 2 relates to an AFE circuit in which overall gain adjustment is distributed between CDS and PGA, thereby achieving a simple circuit structure and reduced chip area of the circuit. Patent Document 3 relates to a CMOS correlated double sampler (CDS) circuit with low noise and low power consumption.

[Patent Document 1]
Japanese Unexamined Patent Publication No. 2002-57945

[Patent Document 2]
Japanese Unexamined Patent Publication No. 2005-45786

[Patent Document 3]
Japanese Unexamined Patent Publication No. Hei 11(1999)-103422

SUMMARY OF THE INVENTION

The present inventors deliberated the AFE techniques as noted above and the deliberations have revealed the following.

For instance, in the example of FIG. 12, due to that charges sampled on the input capacitors c2, c3 move to the feedback capacitors c4, c5, signal amplification is performed. Input signal is amplified at ratios of c2/c4 and c3/c5 and this amplification appears at the output as a difference between a positive output vop and a negative output von. However, the positive output vop and negative output von cannot go beyond a range between a supply voltage and ground. Thus, in case a large signal is input, the amplifier outputs saturate and stick to the supply voltage and the ground. Even in this case, because the chargers are stored on the input capacitors c2, c3, redistribution of the charges is performed with active input, while the outputs are static. In consequence, a virtual short-circuit of input lines to the CDS amplifier becomes inoperative, which in turn causes the amplifier inputs to be open, which would remain at substantially constant voltages under normal condition.

In case the input of a large signal continues, the virtual short-circuit remains inoperative and, hence, signals having a large difference in voltage between them continue to be applied to the input differential pair transistors in the CDS amplifier. Charges are injected into the interfaces of the oxide films of the gates of the input differential pair transistors and this makes change in the threshold voltage Vth of these transistors. This phenomenon is known as slow trap. In consequence, the characteristics of the input differential pair transistors are varied, which changes the response characteristic of the CDS amplifier.

The charges injected into the transistors are slowly discharged even after the large signal input stops. The changed characteristics of the transistors do not return to normal immediately and the response characteristic of the CDS amplifier remains abnormal until the characteristics of the transistors have recovered. That is, it happens that the response of the CDS amplifier to the same signal differs before and after an excessive signal input.

Figure 14:
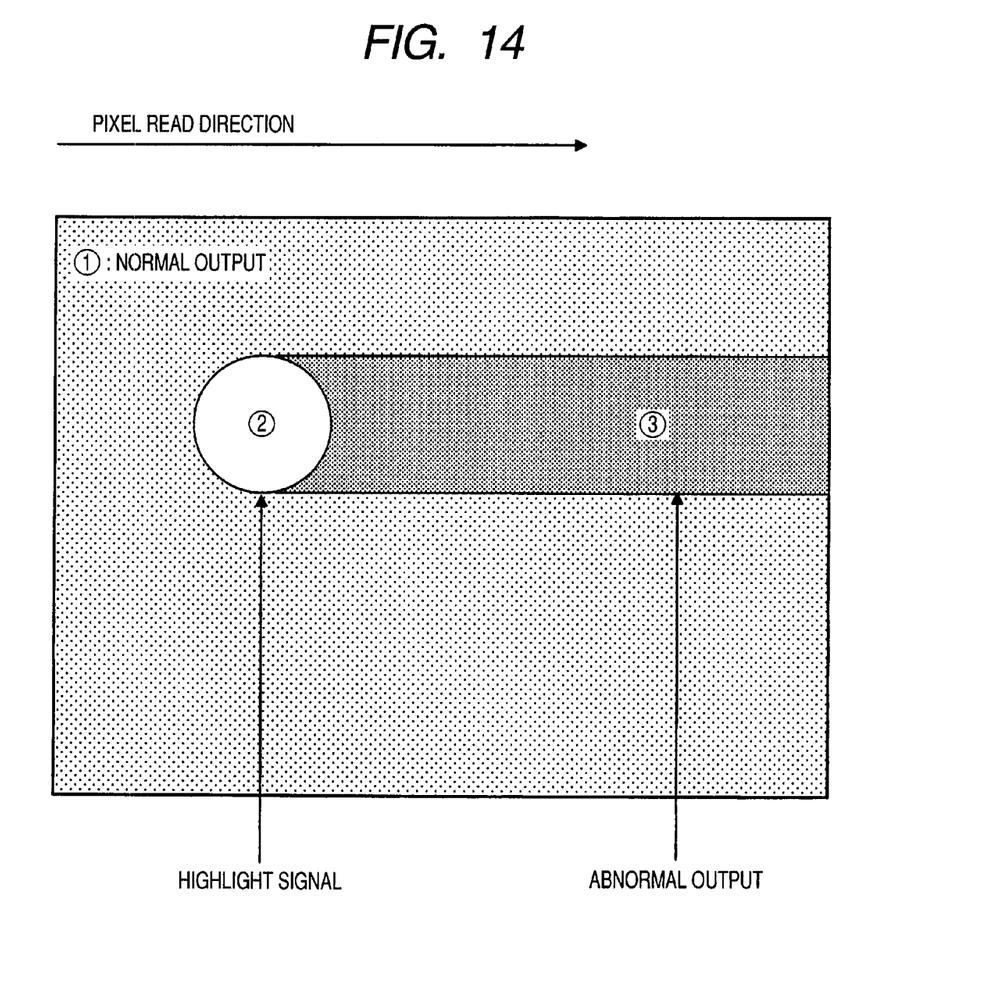
FIG. 14 illustrates an image output example resulting from excessive signal input in the AFE examined as related art assumed to be improved by the present invention.

In a camera system or the like, this excessive signal input is displayed as a highlight signal from a bright light source or the like. Due to difference in the characteristic of the CDS amplifier before and after the excessive signal input, an image, for example, such as a highlight tail, which does not exist actually, appears in an output image, as is illustrated in FIG. 14. FIG. 14 illustrates an image output example resulting from excessive signal input in the AFE examined as related art assumed to be improved by the present invention.

For a semiconductor integrated circuit device such as AFE including a CDS amplifier, in case of excessive signal input to the CDS amplifier, one object of the present invention is to provide a technique that is capable of preventing the response characteristic of the CDS amplifier from deteriorating.

The above-noted and other objects and novel features of the present invention will become apparent from the following description in the present specification and the accompanying drawings.

A typical one of embodiments of the invention disclosed in this application is summarized as follows.

A semiconductor integrated circuit device according to a typical embodiment is an AFE including a CDS amplifier, wherein the CDS amplifier is prevented from becoming saturated by detecting an excessive signal input and triggering the reset of the CDS amplifier (by fixing its inputs to a constant voltage) Thereby, no abnormality occurs in the transient response of the CDS amplifier. Specifically, comparison of input signals to the CDS amplifier is performed by a comparator and the CDS amplifier is reset in case of excessive signal input, so that the CDS amplifier will not amplify excessive signal inputs.

According to the typical embodiment, in a semiconductor integrated circuit device such as AFE including a CDS amplifier, the reset of the CDS amplifier is triggered when an excessive signal input to the CDS amplifier has been detected. Thus, the CDS amplifier is not saturated and it is possible to prevent the response characteristic of the CDS amplifier from deteriorating.

BRIEF DESCRIPTION OF THE DRAWINGS

FIG. 12($a$) is a circuit diagram showing a specific configuration example of a CDS block in FIG. 11 and FIG. 12($b$) is a diagram showing a configuration example of input capacitors (variable capacitors).

DETAILED DESCRIPTION OF THE PREFERRED EMBODIMENTS

In the following, embodiments of the present invention will now be described in detail based on the drawings. In all figures to explain the embodiments, similar and corresponding elements are assigned the same reference designations and their repetitive explanations are omitted. Unless noted otherwise, the designations of terminals, essentially, also designate wiring lines and signals associated with the terminals and, may indicate voltage values if the relevant terminals are for power supply.

In the following description of embodiments, a plurality of sections or embodiments are described separately, if required for convenience. These sections and embodiments are not independent of each other, but are correlated such that one is a modification example, details, supplementary explanation, etc. of a part or all of another, except as specifically indicated. In the following description of embodiments, where the number of elements (including the number of pieces, a value, quantity, range, etc.) is referred to, it is not limited to a specific number, rather it may be mote or less than the specific number, except as specifically indicated and unless it is evidently limited to a specific number in principle.

First Embodiment

Figure 1:
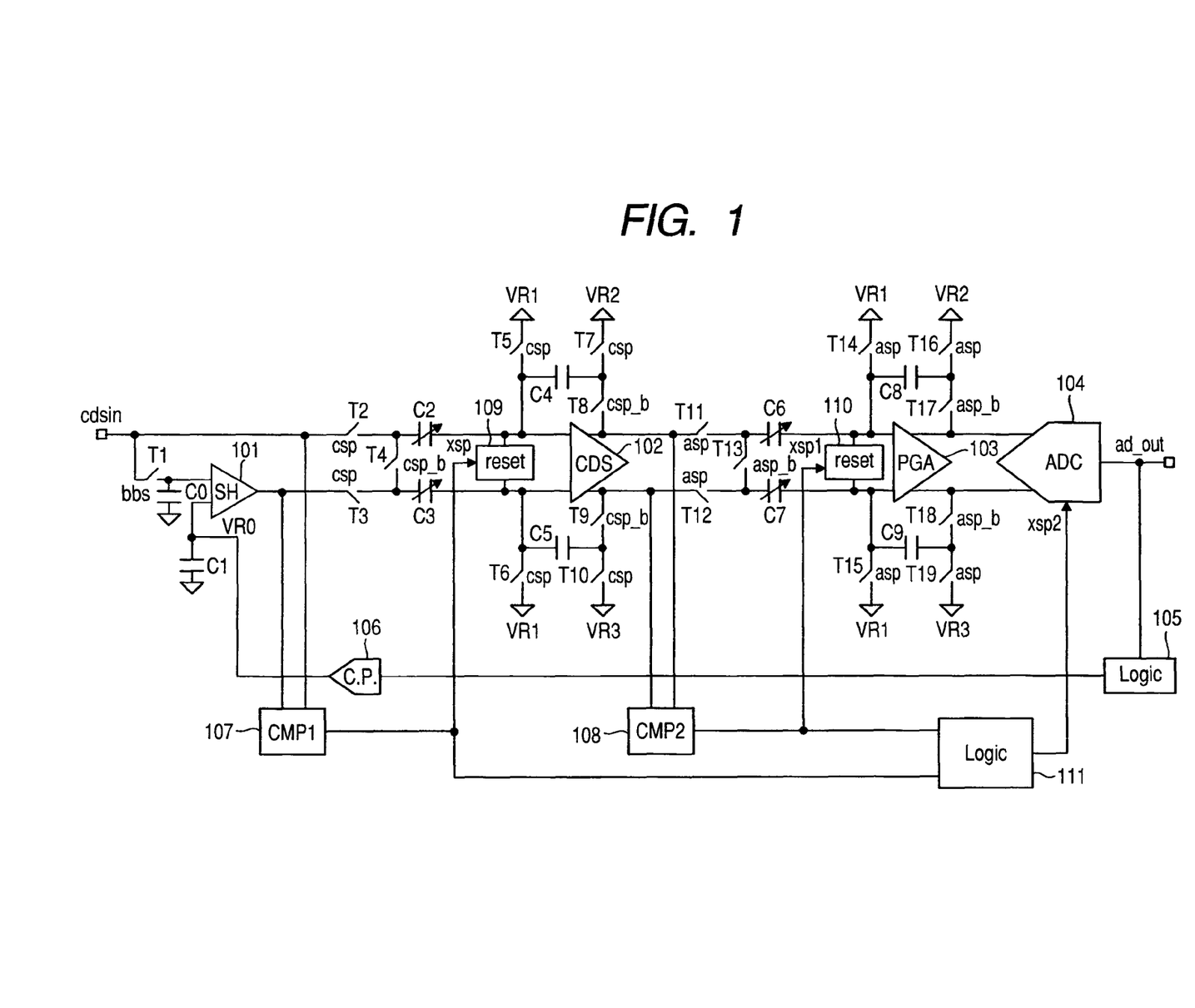
FIG. 1 is a circuit diagram showing a configuration example of a semiconductor integrated circuit device (AFE) according to a first embodiment of the present invention.
Figure 2:
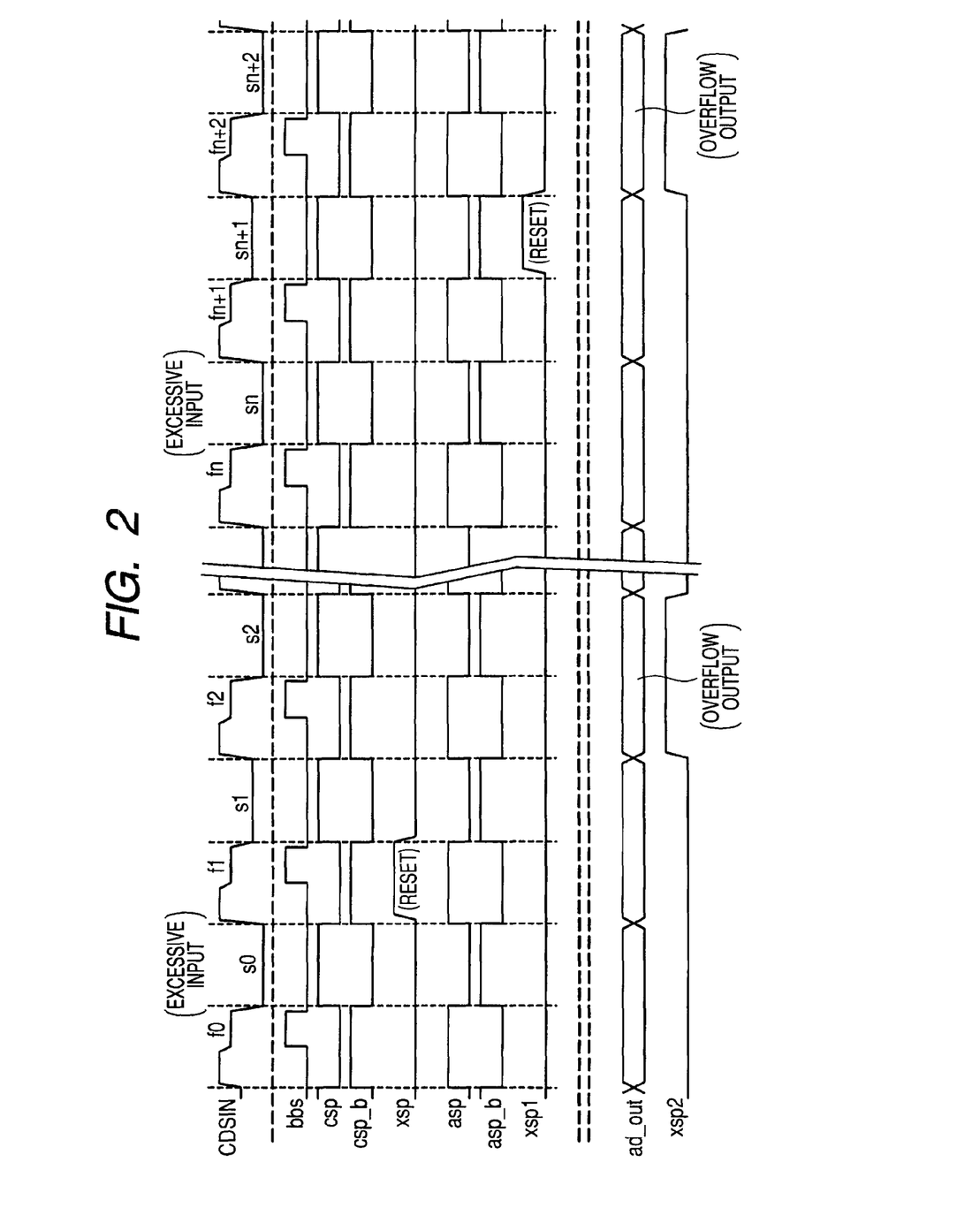
FIG. 2 is a waveform chart showing an example of operation timing of the semiconductor integrated circuit device (AFE) according to the first embodiment of the present invention.

FIG. 1 is a circuit diagram showing a configuration example of a semiconductor integrated circuit device according to a first embodiment of the present invention. FIG. 2 is a waveform chart showing an example of operation timing of same.

According to FIG. 1, first, one example of the configuration of a semiconductor integrated circuit device according to the first embodiment is described. The semiconductor integrated circuit device of the first embodiment is used as a preprocessing LSI (AFE) for, for example, mobile phones equipped with a camera, digital still cameras and digital video cameras. This device is formed on a single or a plurality of semiconductor chips by a well-known semiconductor manufacturing technology.

As shown in FIG. 1, the semiconductor integrated circuit device (AFE) according to the first embodiment is configured by adding comparators (CMP1, CMP2) and reset circuits (reset) to the AFE shown in FIGS. 11 and 12. That is, the AFE according to the first embodiment is comprised of the following elements: a sample and hold amplifier (SH) 101; a CDS amplifier 102; a PGA amplifier 103; an A/D converter (ADC) 104; a logic circuit (Logic) 105; a charge pump (C. P) 106; a comparator (CMP1) 107; a comparator (CMP2) 108; a reset circuit (reset) 109; a reset circuit (reset) 110; a logic circuit (Logic) 111; a offset holding capacitor c1; input capacitors c0, c2, c3, c6, c7; feedback capacitors c4, c5, c8, c9; input switches T1 to T3, T11, T12; switches T4 to T10, T13 to T19; and the like.

The CDS amplifier 102 and the PGA amplifier 103 are the amplifiers for differential amplification of a switched capacity type and their gains are made variable by the input capacitors/feedback capacitors. A comparator (CMP1) 107 decides whether a difference between a signal input from a sensor signal input cdsin and an output of the sample and hold amplifier (SH) 101 is an excessive signal input and controls the reset circuit (reset) 109 according to a comparison result signal xsp. When the comparison result signal xsp indicates an excessive signal input, the reset circuit 109 fixes the input terminals of the CDS amplifier 102 to a constant voltage.

The comparator (CMP2) 108 decides whether an output of the CDS amplifier 102 is an excessive signal and controls the reset circuit (reset) 110 according to a comparison result signal xsp1. When the comparison result signal xsp1 indicates an excessive signal, the reset circuit 110 fixes the input terminals of the PGA amplifier 103 to a constant voltage.

In case either the CDS amplifier 102 or the PGA amplifier 103 has become to receive an excessive signal input, the logic circuit (Logic) 111 causes the output of the A/D converter (ADC) 104 to overflow by sending a control signal xsp2. Overflow denotes, for example, an output stream of all "1s" from the A/D converter 104.

According to FIG. 2, the operation of the AFE shown in FIG. 1 is explained. For each signal that is input from the image sensor (CCD) to the sensor signal input cdsin, its feed-through part f0 is sampled on an input capacitor c0 via an input switch T1. A difference between the feed-throughpart f0 and a signal VR0 is output from the sample and hold amplifier (SH) 101 which holds a black level signal. The signal VR0 is an offset voltage that is applied to cancel out the sensor offset.

Then, the input switch T1 turns off and the output of the sample and hold amplifier (SH) 101 is sampled on an input capacitor C3 via an input switch T3. Meanwhile, a signal part s0 of the sensor signal input to the sensor signal input cdsin is sampled on an input capacitor C2 via an input switch T2. At this time, feedback capacitors C4, C5 are coupled to reference voltages VR1, VR2, VR3. Byway of example, when a supply voltage Vdd is 3 V, VR1=Vdd/2, VR2=2 V, VR3=1 V, C4=C4, and C8=C9.

At the same time, the black level signal output from the sample and hold amplifier (SH) 101 and the signal part s0 input to the sensor signal input cdsin are input to the comparator (CMP1) 107 and the comparison result signal xsp is output from the comparator (CMP1) 107. When the comparator (CMP1) 107 has decided that an excessive signal input occurs, the comparison result signal xsp becomes active.

Then, the input switches T2, T3 and switches T5 to T7 and T10 turn off and switches T4, T8 and T9 turn on, so that the signal is amplified by a gain that is determined by c2/c4 and c3/c5.

At this time, if the comparison result signal xsp is active, the reset circuit (reset) 109 is actuated to fix the input terminals of the CDS amplifier 102 to a constant voltage. In consequence, the CDS amplifier 102 becomes incapable of amplifying the signal.

During an amplification period of the CDS amplifier 102, the outputs of the CDS amplifier 102 are sampled on capacitors C6, C7 through input switches T11, T12. At this time, feedback capacitors C8, C9 are coupled to reference voltages VR, VR1, VR2. At the same time, the outputs of the CDS amplifier 102 are input to the comparator (CMP2) 108 and a comparison result signal xsp1 is output. When the comparator (CMP2) 108 has decided that an excessive signal input occurs, the comparison result signal xsp1 becomes active.

Then, the input switches T11, T12 and switches T14 to T16 and T19 turn off and switches T13, T17 and T18 turn on, so that the signal is amplified by a gain that is determined by C6/C8 and C7/C9.

At this time, if the comparison result signal xsp1 is active, the reset circuit 110 is actuated to fix the input terminals of the PGA amplifier 103 to a constant voltage. In consequence, the PGA amplifier 103 becomes incapable of amplifying the signal.

If either the comparison result signal xsp or xsp1 is active, the control signal xsp2 becomes active, causing the output ad_out of the ADC 104 to overflow. As an overflow output, for example, a stream of all "1s" is output.

Therefore, according to the semiconductor integrated circuit device of the first embodiment, it can be decided whether an excessive signal input occurs by input amplitude comparison for the CDS amplifier or the PGA amplifier. When the relevant comparator has decided that an excessive signal input occurs, this decision triggers the reset of the CDS amplifier or the PGA amplifier. Saturation of the CDS amplifier or the PGA amplifier due to an excessive signal input can thus be avoided.

Second Embodiment

Figure 3:
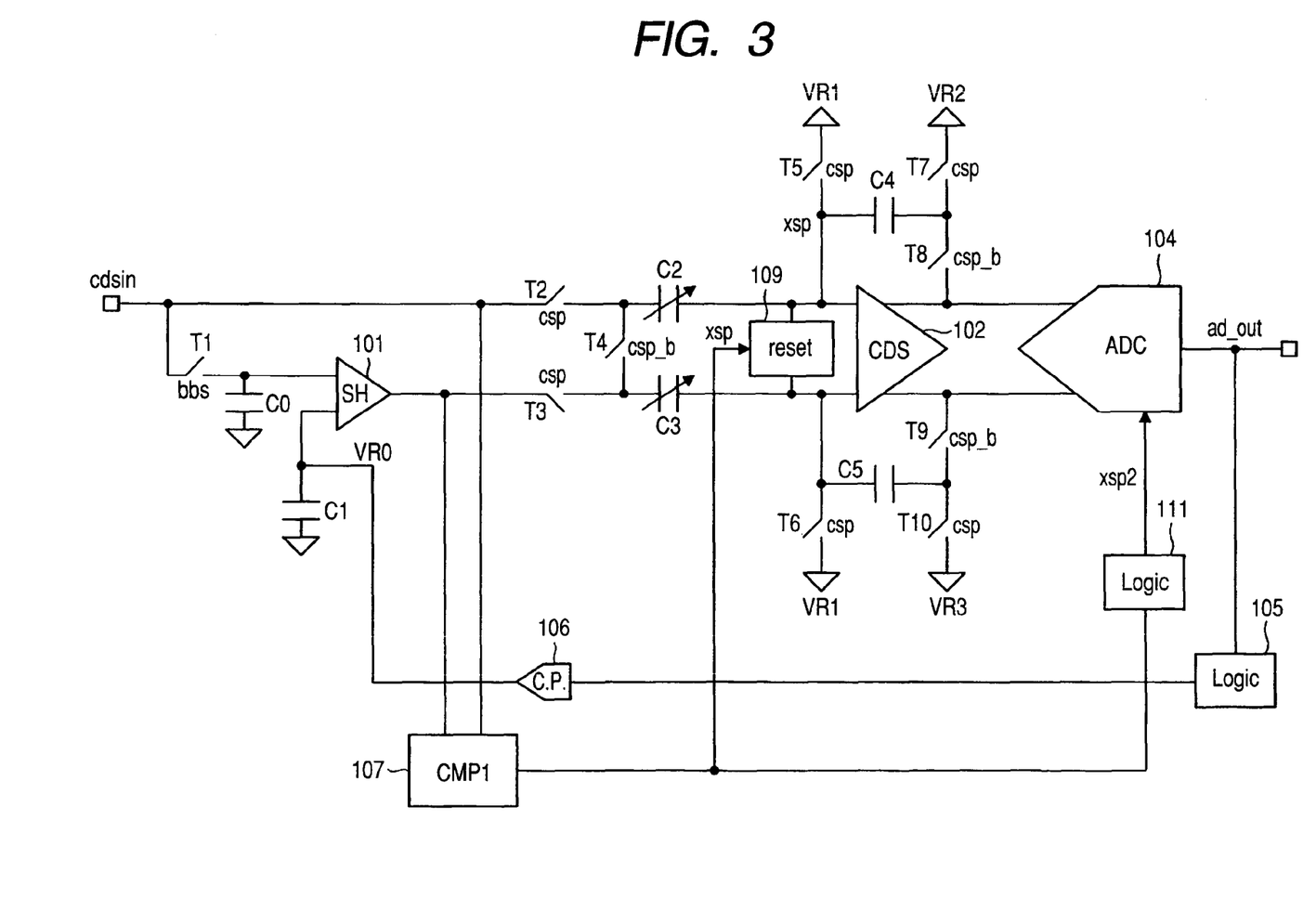
FIG. 3 is a circuit diagram showing a configuration example of a semiconductor integrated circuit device (AFE) according to a second embodiment of the present invention.
Figure 4:
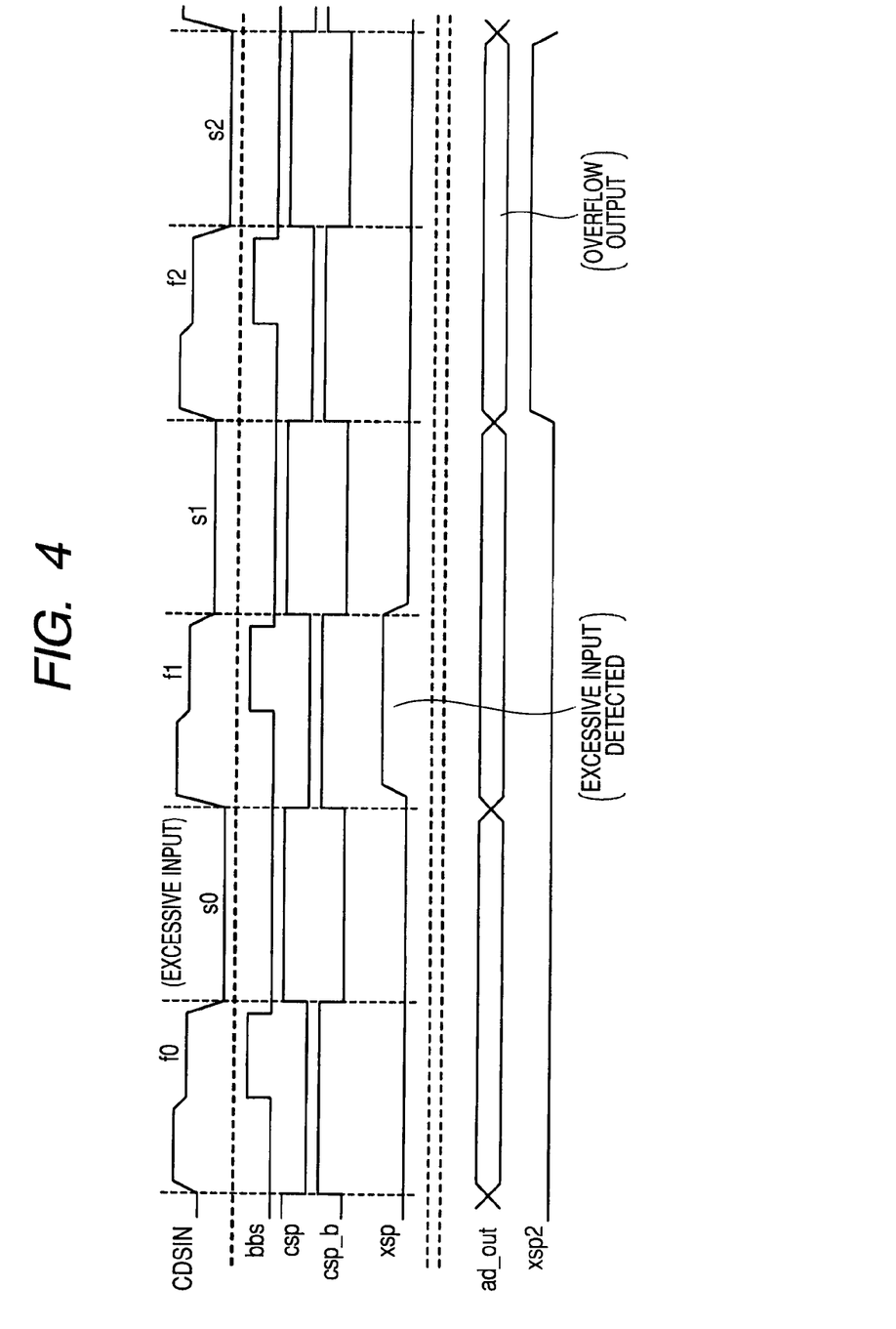
FIG. 4 is a waveform chart showing an example of operation timing of the semiconductor integrated circuit device (AFE) according to the second embodiment of the present invention.

FIG. 3 is a circuit diagram showing a configuration example of a semiconductor integrated circuit device according to a second embodiment of the present invention. FIG. 4 is a waveform chart showing an example of operation timing of same. As shown in FIG. 3, the semiconductor integrated circuit device (AFE) according to the second embodiment is configured such that the PGA amplifier and the comparator (CMP2) are removed from the configuration shown in FIG. 1.

The comparator (CMP1) 107 decides whether a difference between a signal part s0 to s2 input from a sensor signal input cdsin and an output of the sample and hold amplifier (SH) 101 is an excessive signal input, outputs a comparison result signal xsp to the reset circuit 109 and controls the reset circuit 109.

When the CDS amplifier 102 has become to receive an excessive signal input, logic circuit (Logic) 111 causes the output of the ADC 104 to overflow by sending a control signal xsp2.

According to FIG. 4, the operation of the AFE shown in FIG. 3 is explained. For each sensor signal from the image sensor (CCD), its feed-through part f0 is sampled on an input capacitor C0 via an input switch T1. A difference between the feed-through part f0 and a signal VR0 for canceling out the sensor offset is output from the sample and hold amplifier 101.

Then, the input switch T1 turns off and the output of the sample and hold amplifier (SH) 101 is sampled on an input capacitor C3 via an input switch T3. Meanwhile, a signal part s0 input to the sensor signal input cdsin is sampled on an input capacitor C2 via an input switch T2. At this time, feedback capacitors C4, C5 are coupled to reference voltages VR1 to VR3. At the same time, the output (a black level signal compensated by offset) of the sample and hold amplifier 101 and the signal part s0 input to the sensor signal input cdsin are input to the comparator (CMP1) 107 and the comparison result signal xsp is output. When the comparator (CMP1) 107 has decided that an excessive signal input occurs, the comparison result signal xsp becomes active.

Then, the input switches T2, T3 and switches T5 to T7 and T10 turn off and switches T4, T8 and T9 turn on, so that the signal is amplified by a gain that is determined by c2/c4 and c3/c5.

At this time, if the comparison result signal xsp is active, the reset circuit (reset) 109 is actuated to fix the input terminals of the CDS amplifier 102 to a constant voltage. In consequence, the CDS amplifier 102 becomes incapable of amplifying the signal.

If the comparison result signal xsp to detect an excessive signal input is active, the control signal xsp2 becomes active, causing the output ad_out of the ADC 104 to overflow.

Therefore, according to the semiconductor integrated circuit device of the second embodiment, the same advantageous effect can be achieved as in the first embodiment. Removal of the PGA amplifier decreases the chip area for the AFE and reduces power consumption.

Third Embodiment

Figure 5:
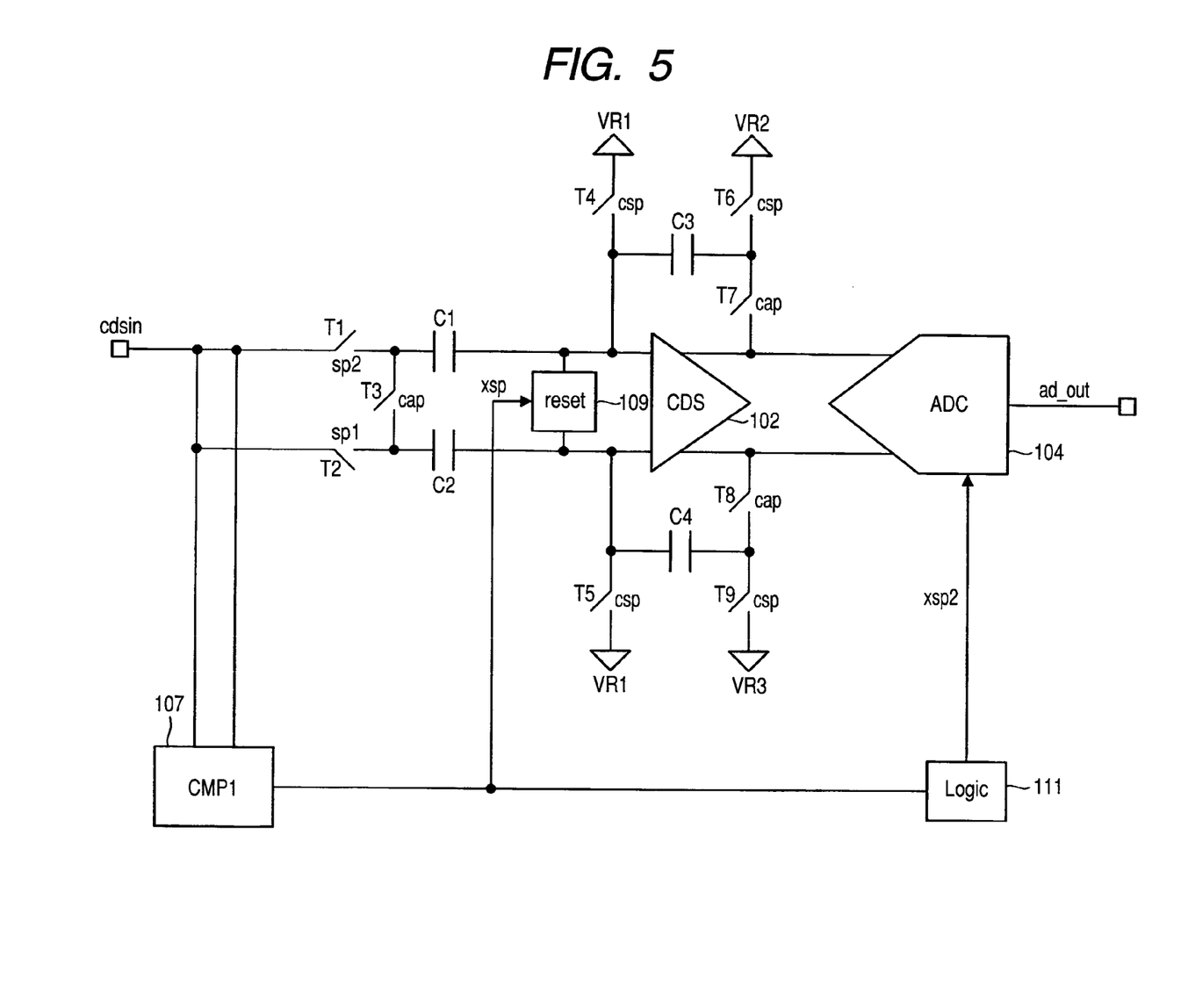
FIG. 5 is a circuit diagram showing a configuration example of a semiconductor integrated circuit device (AFE) according to a third embodiment of the present invention.
Figure 6:
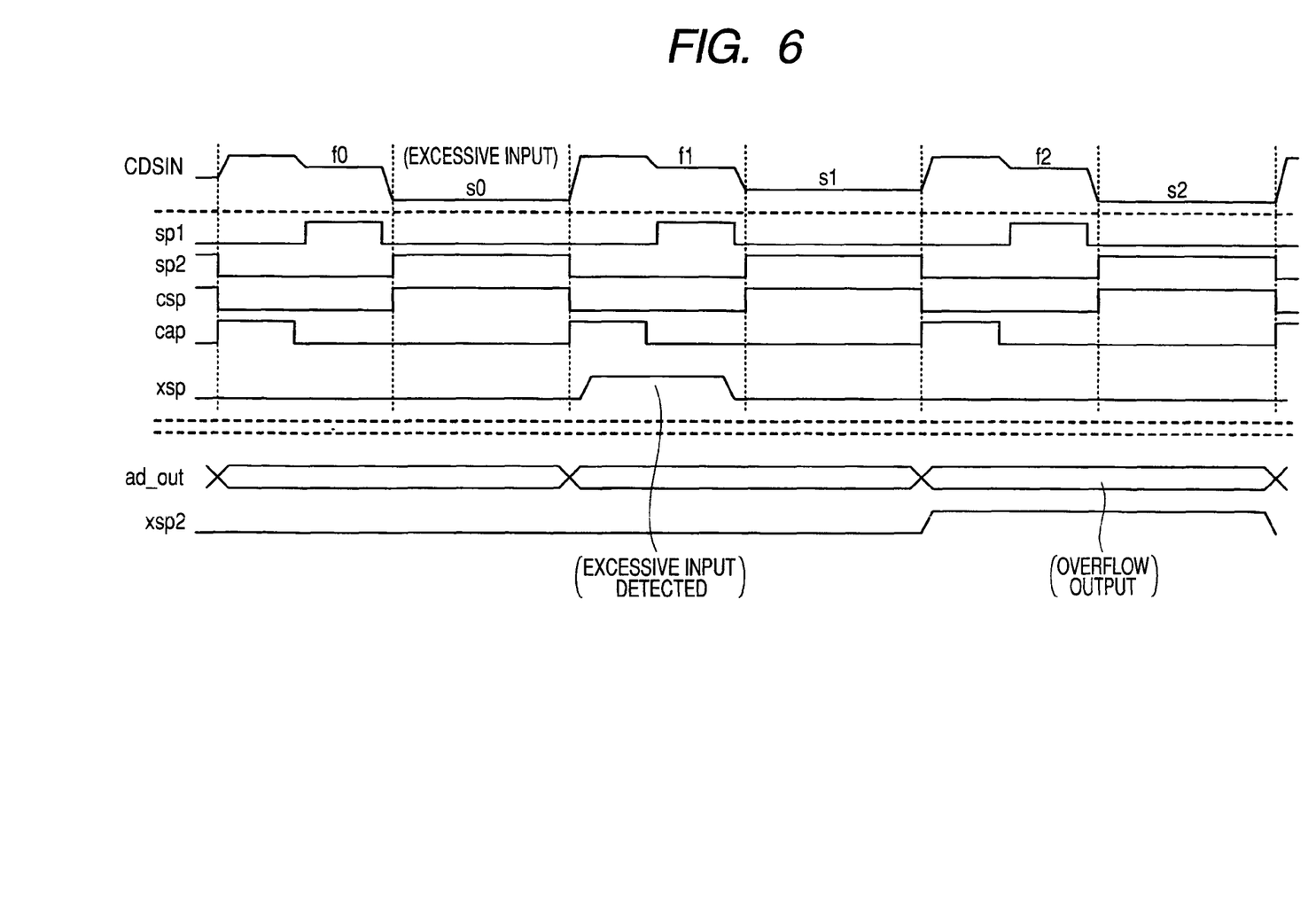
FIG. 6 is a waveform chart showing an example of operation timing of the semiconductor integrated circuit device (AFE) according to the third embodiment of the present invention.

FIG. 5 is a circuit diagram showing a configuration example of a semiconductor integrated circuit device according to a third embodiment of the present invention. FIG. 6 is a waveform chart showing an example of operation timing of the device.

As shown in FIG. 5, the semiconductor integrated circuit device (AFE) according to the third embodiment is configured such that the sample and hold amplifier is removed from the configuration shown in FIG. 3.

According to FIG. 6, the operation of the AFE shown in FIG. 5 is explained. For each sensor signal from the image sensor (CCD), its feed-through part f0 is sampled on an input capacitor C2 via an input switch T2. Then, the input switch T2 turns off and a signal part s0 is sampled on an input capacitor C1 via an input switch T1. At this time, feedback capacitors C3, C4 are coupled to reference voltages VR1 to VR3. At the same time, it is decided by the comparator (CMP1) 107 whether a difference between the signal part s0 and the feed-through part f0 is an excessive signal input and a comparison result signal xsp is output. In case of an excessive signal input, the comparison result signal xsp becomes active.

Then, the input switches T1, T2 and switches T4 to T6 and T9 turn off and switches T3, T7 and T8 turn on, so that the signal is amplified by a gain that is determined by C2/C4 and C1/C3.

At this time, if the comparison result signal xsp is active, the reset circuit 109 is actuated to fix the input terminals of the CDS amplifier 102 to a constant voltage. In consequence, the CDS amplifier 102 becomes incapable of amplifying the signal. In the case that an excessive signal input is detected and the comparison result signal xsp is active, the control signal xsp2 becomes active, causing the output ad_out of the ADC 104 to overflow.

Therefore, according to the semiconductor integrated circuit device of the third embodiment, the same advantageous effect can be achieved as in the second embodiment. Owing to no need of the sample and hold amplifier and the offset holding capacitor c1, the chip area for the AFE is further decreased and power consumption is reduced.

Fourth Embodiment

Figure 7:
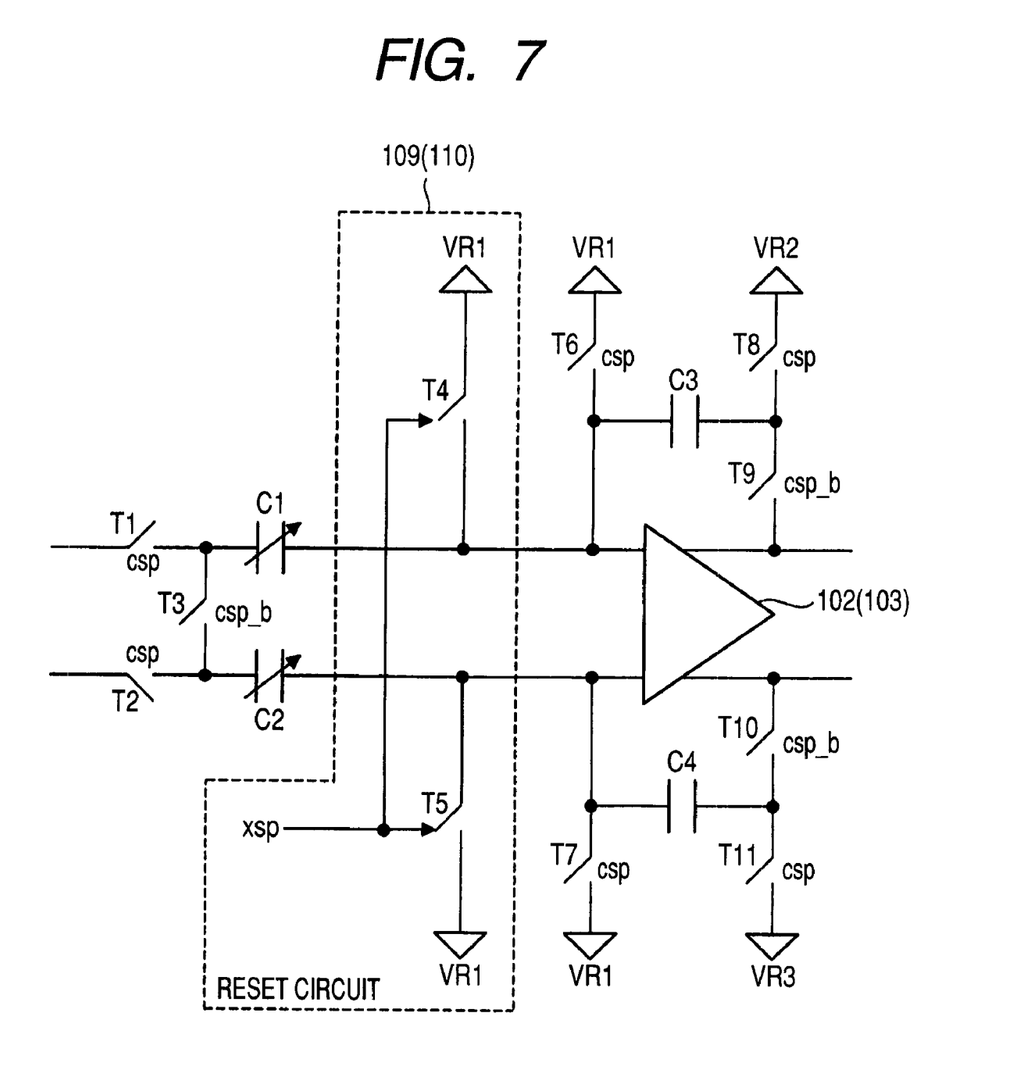
FIG. 7 is a circuit diagram showing a configuration example of a reset circuit (reset) shown in FIGS. 1, 3 and 5.

FIG. 7 is a circuit diagram showing a configuration example of the reset circuit (reset) 109, 110 shown in FIGS. 1, 3 and 5.

As shown in FIG. 7, the reset circuit of the fourth embodiment is configured such that switches T4, T5 which are controlled by the comparison result signal xsp (xsp1) are, respectively, provided between the input terminals of the CDS amplifier 102 (PGA amplifier 103) and the reference voltages VR1. Depending on the comparison result signal xsp (xsp1), the input terminals of the CDS amplifier 102 (PGA amplifier 103) may be coupled to the reference voltages VR1 via the switches T4, T5, respectively.

By this configuration, in case of an excessive signal input, the input terminals of the CDS amplifier 102 (PGA amplifier 103) are fixed to the reference voltages VR1 and the reset of the CDS amplifier 102 (PGA amplifier 103) can thus be triggered.

Consequently, in case of an excessive signal input, fixed voltages are only supplied to the input terminals of the amplifier, which in turn deactivates the amplification operation and can prevent saturation of the amplifier.

Unless the comparison signal xsp (xsp1) becomes active, normal operation is performed, as the reset is not triggered.

Fifth Embodiment

Figure 8:
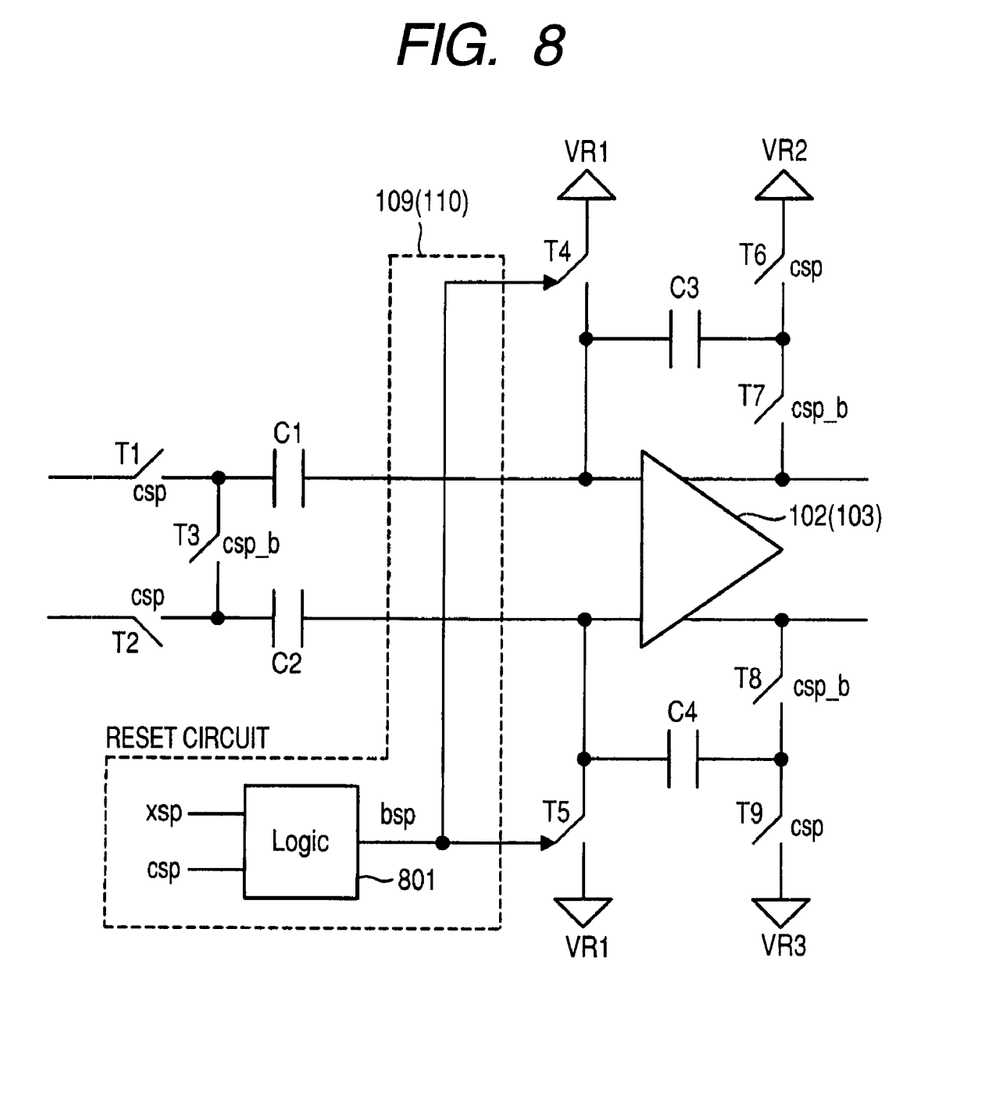
FIG. 8 is a circuit diagram showing another configuration example of a reset circuit (reset) shown in FIGS. 1, 3 and 5.

FIG. 8 is a circuit diagram showing another configuration example of the reset circuit (reset) 109, 110 shown in FIGS. 1, 3 and 5.

As shown in FIG. 8, the reset circuit of the fifth embodiment is configured such that a logic circuit (Logic) 801 taking the inputs of a comparison result signal xsp (xsp1) and a control signal csp and outputting a control signal bsp is provided, wherein the switches T4, T5 are turned on/off by the control signal bsp. In the logic circuit (Logic) 801, the control signal bsp is generated from the comparison result signal xsp (xsp1) and the control signal csp. The control signal bsp controls the switches T4, T5, depending on whether an excessive signal input occurs.

The switches T4, T5 are off during normal amplification, but they remain on during an excessive signal input. Thereby, the input terminals of the CDS amplifier 102 (PGA amplifier 103) are coupled to the reference voltages VR1 via the switches T4, T5, respectively.

Thus, by turning the switches T4, T5, which are off during normal amplification, on when an excessive signal input occurs, the input terminals of the CDS amplifier 102 (PGA amplifier 103) are fixed to the reference voltages VR1 and the reset is triggered.

Hence, in case of an excessive signal input, fixed voltages are only supplied to the input terminals of the CDS amplifier 102 (PGA amplifier 103), which in turn deactivates the amplification operation and can prevent saturation of the amplifier.

Unless the comparison signal xsp (xsp1) becomes active, normal amplification operation is performed, as the reset is not triggered.

Sixth Embodiment

Figure 9:
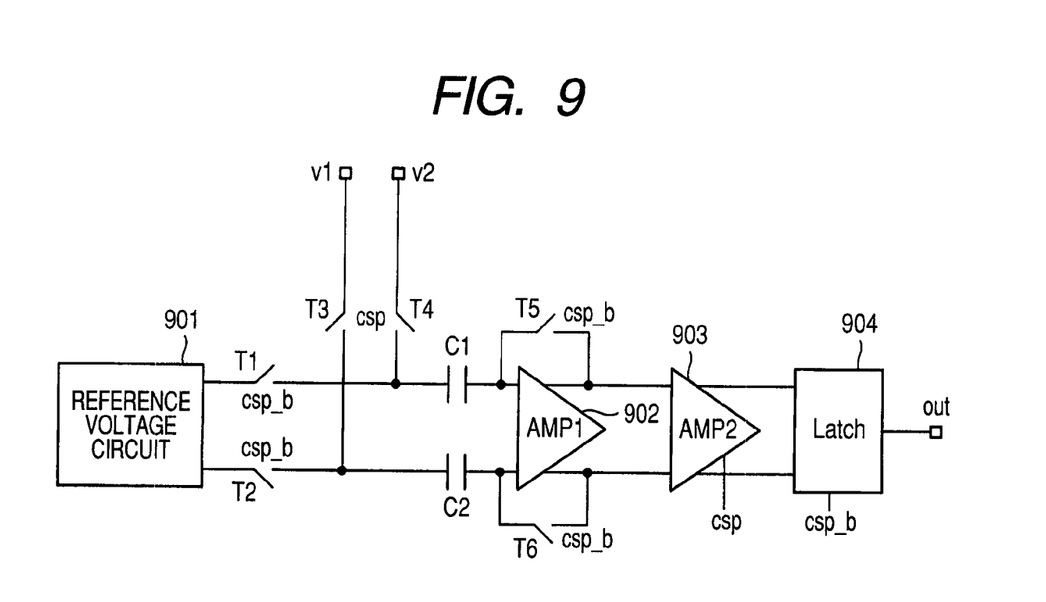
FIG. 9 is a circuit diagram showing a configuration example of each comparator (CMP1, CMP2) shown in FIGS. 1, 3 and 5.
Figure 10:
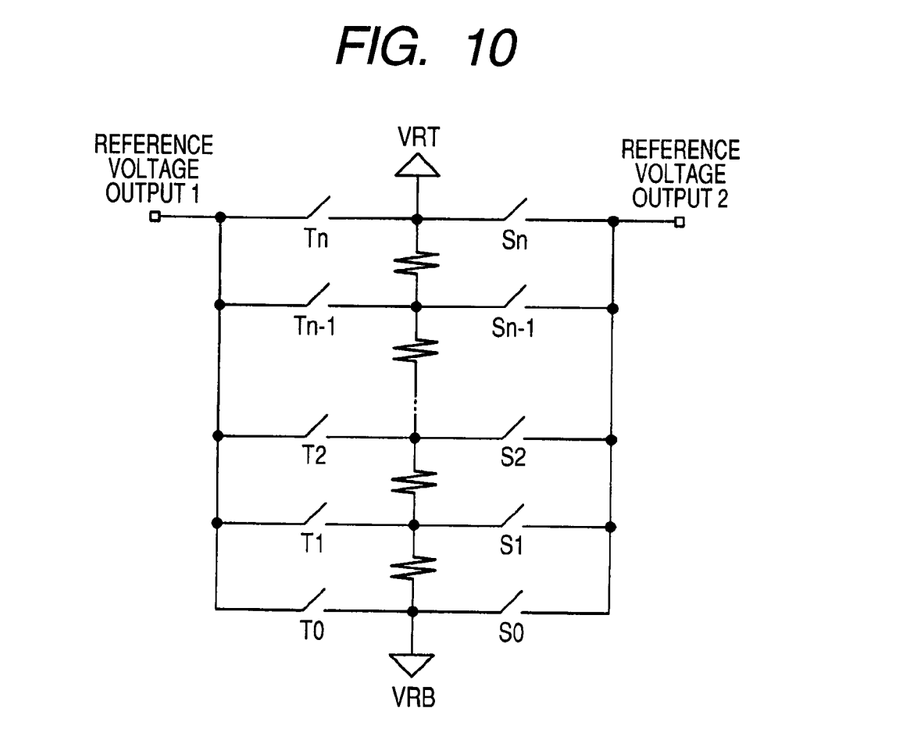
FIG. 10 is a circuit diagram showing a configuration example of a reference voltage circuit shown in FIG. 9.

FIG. 9 is a circuit diagram showing a configuration example of each comparator (CMP1, CMP2) shown in FIGS. 1, 3 and 5. FIG. 10 is a circuit diagram showing a configuration example of a reference voltage circuit 901 shown in FIG. 9.

As shown in FIG. 9, the comparator according to the sixth embodiment is comprised of input capacitors C1, C2 which sample signals, an amplifier (AMP1) 902 which amplifies voltage differences between differential voltages of input signals v1, v2 and outputs of the reference voltage circuit 901, an amplifier (AMP2) 903 which amplifies the outputs of the amplifier (AMP1), and a latch (Latch) 904 which latches and outputs the result.

This comparator operates as follows. First, the outputs of the reference voltage circuit 901 (reference voltage outputs 1, 2) are sampled on the input capacitors C1, C2 via switches T1, T2. At this time, the lines between the inputs and outputs of the amplifier (AMP1) 902 are self-biased by switches T5, T6, respectively.

Then, a control signal csp becomes active and a control signal csp_b becomes inactive, thereby turning the switches T1, T2, T5, T6 off and the switches T3, T4 on. Input signals v1, v2 are compared to the reference voltage outputs 1, 2 sampled on the input capacitors C1, C2, respectively. Resulting voltage differences are amplified by the amplifier (AMP1) 902 and the amplifier (AMP2) 903.

Then, the control signal csp becomes inactive and the control signal csp_b becomes active. Thereby, the outputs of the amplifier (AMP2) 903 are latched by the latch 904 and output.

The reference voltage outputs 1, 2 are used for deciding whether the input signals v1, v2 are excessive and may be changed, depending on respective gain setting of the CDS block and the PGA block in FIGS. 1, 3 and 5. For example, the difference between the reference voltage outputs 1, 2 becomes larger when the gain setting is lower. The difference between the reference voltage outputs 1, 2 becomes smaller when the gain setting is higher.

As means for generating the reference voltage outputs 1, 2, for example, a resistor ladder DAC (Digital to Analog Converter) which is shown in FIG. 10 is used. Depending on the respective gain setting of the CDS block and the PGA block, one of switches S0 to Sn and one of switches T0 to Tn are selected. VRT and VRB are optional voltages. As the input signals v1, v2, the signals to be supplied to the input terminals of the CDS amplifier 102 or the PGA amplifier 103 are input.

Therefore, by the comparator of the sixth embodiment, the reference voltage outputs 1, 2 are first sampled and input signals are compared to them when they are input. Thereby, the result of the comparison has already been obtained when these signals are amplified by the CDS amplifier and the PGA amplifier shown in FIGS. 1, 3 and 5. Thus, it is possible to avoid amplifying excessive input signals.

By using, for example, the resistor ladder DAC to generate the reference voltage outputs 1, 2, it is possible to generate optimum reference voltage outputs 1, 2 depending on the respective gain setting of the CDS amplifier and the PGA amplifier.

By appropriately combining the AFE according to one of the first to third embodiments, the reset circuit according to one of the fourth and fifth embodiments, and the comparator according to the sixth embodiment, the following functions and effects can be achieved.

For a CDS amplifier or a PGA amplifier of switched capacitor type, saturation of the amplifier is prevented by deciding whether the amplitude of sampled input signals is excessive and resetting the amplifier not to perform amplification in case of an excessive signal input detected. When the amplitude of input signals has returned to a normal level, signal amplification is performed as per normal without being reset. Thus, the amplifier is prevented from becoming saturated and no abnormality occurs in transient response.

While the invention made by the present inventors has been described specifically based on its embodiments hereinbefore, it will be appreciated that the present invention is not limited to the described embodiments and various modifications thereto may be made without departing from the gist of the invention.

The present invention is effective for a CDS amplifier or a PGA amplifier of switched capacitor type and AFE using these amplifiers.

What is claimed is:

1. A semiconductor integrated circuit device comprising:
   a correlated double sampling (CDS) amplifier of switched capacitor type with first and second inputs;
   a first comparator for comparing a first voltage between the first and second inputs with a second voltage;
   a first circuit for fixing the first and second inputs of the CDS amplifier to a constant voltage, when the first comparator has decided that the first voltage is larger than the second voltage;
   an analog/digital (A/D) converter placed at an output side of the CDS amplifier; and
   a second circuit for causing the output of the A/D converter to overflow, when the first comparator has decided that the first voltage is larger than the second voltage.

2. The semiconductor integrated circuit device according to claim 1, further comprising:
   a programmable gain amplifier (PGA) of switched capacitor type with third and forth inputs, located at an output side of the CDS amplifier;
   a second comparator for comparing a third voltage between the third and fourth inputs with a fourth voltage; and
   a third circuit for fixing the third and fourth inputs of the PGA amplifier to a constant voltage, when the second comparator has decided that the third voltage is larger than the fourth voltage.

3. The semiconductor integrated circuit device according to claim 2, further comprising:
   an A/D converter placed at an output side of the PGA amplifier; and
   a fourth circuit for causing the output of the A/D converter to overflow, when the first comparator has decided that the first voltage is larger than the second voltage or when the second comparator has decided that the third voltage is larger than the fourth voltage.

4. The semiconductor integrated circuit device according to claim 1,
   wherein the second voltage may vary depending on the gain of the CDS amplifier.

5. The semiconductor integrated circuit device according to claim 2,
   wherein the fourth voltage may vary depending on the gain of the PGA amplifier.

6. The semiconductor integrated circuit device according to claim 1, further comprising;

a sample hold amplifier inputting the first voltage and outputting the second voltage, wherein the first comparator decides whether a difference between the first voltage from a sensor signal input and the second voltage of output of the sample and hold amplifier is an excessive signal input.

7. A semiconductor integrated circuit device comprising:

a correlated double sampling (CDS) amplifier of switched capacitor type with first input and a second input;

a first comparator for comparing a first voltage of the first input and a second voltage of the second input;

a first circuit for fixing the first and second inputs of the CDS amplifier to a constant voltage, when the first comparator has decided that the first voltage is larger than the second voltage;

a programmable gain amplifier (PGA) amplifier of switched capacitor type with third and forth inputs, located at an output side of the CDS amplifier;

a second comparator for comparing a third voltage between the third and fourth inputs with a fourth voltage;

a third circuit for fixing the third and fourth inputs of the PGA amplifier to a constant voltage, when the second comparator has decided that the third voltage is larger than the fourth voltage;

an A/D converter placed at an output side of the PGA amplifier; and a fourth circuit for causing the output of the A/D converter to overflow, when the first comparator has decided that the first voltage is larger than the second voltage or when the second comparator has decided that the third voltage is larger than the fourth voltage.

* * * * *